(12) United States Patent
Kraus et al.

(10) Patent No.: US 7,923,070 B2
(45) Date of Patent: *Apr. 12, 2011

(54) ATOMIC LAYER DEPOSITION METHOD OF FORMING CONDUCTIVE METAL NITRIDE-COMPRISING LAYERS

(75) Inventors: Brenda D. Kraus, Meridian, ID (US); Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 951 days.

This patent is subject to a terminal disclaimer.

(21) Appl. No.: 11/497,692

(22) Filed: Jul. 31, 2006

(65) Prior Publication Data

US 2006/0263523 A1 Nov. 23, 2006

Related U.S. Application Data

(63) Continuation of application No. 10/643,680, filed on Aug. 18, 2003, now Pat. No. 7,378,129.

(51) Int. Cl.
*C23C 16/00* (2006.01)
*H05H 1/24* (2006.01)

(52) U.S. Cl. ............ 427/255.394; 427/255.28; 427/576

(58) Field of Classification Search .................. 427/569, 427/576, 255.28, 255.391, 255.394
See application file for complete search history.

(56) References Cited

U.S. PATENT DOCUMENTS

| | | | |
|---|---|---|---|
| 5,554,501 A | 9/1996 | Coassin et al. | |
| 6,203,613 B1 | 3/2001 | Gates et al. | |
| 6,475,276 B1 * | 11/2002 | Elers et al. | ...................... 117/84 |
| 6,511,539 B1 | 1/2003 | Raaijmakers | |
| 6,528,430 B2 | 3/2003 | Kwan et al. | |
| 6,576,053 B1 | 6/2003 | Kim et al. | |
| 6,730,163 B2 | 5/2004 | Vaartstra | |
| 6,730,164 B2 | 5/2004 | Vaartstra et al. | |
| 6,753,618 B2 | 6/2004 | Basceri et al. | |
| 6,780,704 B1 | 8/2004 | Raaijmakers et al. | |
| 6,787,185 B2 | 9/2004 | Derderian et al. | |
| 6,838,125 B2 | 1/2005 | Chung et al. | |
| 6,863,725 B2 | 3/2005 | Vaartstra et al. | |

(Continued)

FOREIGN PATENT DOCUMENTS

WO  WO 01/27346 A1  4/2001

OTHER PUBLICATIONS

U.S. Appl. No. 10/196,814, filed Jul. 2002, Kyung-In.

(Continued)

*Primary Examiner* — Brian K Talbot
(74) *Attorney, Agent, or Firm* — Wells St. John P.S.

(57) ABSTRACT

This invention includes atomic layer deposition methods of forming conductive metal nitride comprising layers. In one implementation, an atomic layer deposition method of forming a conductive metal nitride comprising layer includes positioning a substrate within a deposition chamber. A first species is chemisorbed to form a first species monolayer onto the substrate from a gaseous first precursor comprising at least one of an amido metal organic compound or an imido metal organic compound. The first species monolayer comprises organic groups. The chemisorbed first species is contacted with a second precursor plasma effective to react with the first species monolayer to remove organic groups from the first species monolayer. The chemisorbing and contacting are successively repeated under conditions effective to form a layer of material on the substrate comprising a conductive metal nitride.

17 Claims, 3 Drawing Sheets

U.S. PATENT DOCUMENTS

| | | | |
|---|---|---|---|
| 7,067,420 | B2 | 6/2006 | Choi et al. |
| 7,098,131 | B2 * | 8/2006 | Kang et al. .................... 438/648 |
| 7,393,562 | B2 | 7/2008 | Derderian et al. |
| 2001/0024387 | A1 | 9/2001 | Raaijmakers et al. |
| 2002/0104481 | A1 * | 8/2002 | Chiang et al. .......... 118/723.001 |
| 2002/0164420 | A1 | 11/2002 | Derderian et al. |
| 2002/0182320 | A1 | 12/2002 | Leskela et al. |
| 2003/0049931 | A1 * | 3/2003 | Byun et al. .................... 438/649 |
| 2003/0082296 | A1 | 5/2003 | Elers et al. |
| 2003/0116087 | A1 | 6/2003 | Nguyen et al. |
| 2003/0168750 | A1 | 9/2003 | Basceri et al. |
| 2003/0176065 | A1 | 9/2003 | Vaartstra |
| 2003/0200917 | A1 | 10/2003 | Vaartstra |
| 2003/0205729 | A1 | 11/2003 | Basceri et al. |
| 2004/0040494 | A1 | 3/2004 | Vaartstra et al. |
| 2004/0152254 | A1 | 8/2004 | Vaartstra et al. |
| 2005/0000431 | A1 * | 1/2005 | Elers ............................ 118/715 |
| 2005/0020060 | A1 | 1/2005 | Aaltonen et al. |
| 2006/0042752 | A1 | 3/2006 | Rueger |
| 2006/0216419 | A1 | 9/2006 | Shero et al. |
| 2006/0231017 | A1 | 10/2006 | Vaartstra |
| 2006/0260750 | A1 | 11/2006 | Rueger |

OTHER PUBLICATIONS

Park et al.. "*Plasma-Enhanced Atomic Layer Deposition of Tantalum Nitrides Using Hydrogen Radicals as a Reducing Agent*", Electrochemical and Solid-State Letters, 4 (4) C17-C19, The Electrochemical Society, Inc. (2001).

D. R. Baghurst et al., *Microwave synthesis for superconducting ceramics*, Nature, vol. 322, pp. 311 (Mar. 24, 1998).

J.S. Elam et al., *Surface chemistry and film growth during TiN atomic layer deposition using TDMAT and $NH_3$*, Thin Solid Films, 12 pages (2003). no. month available.

Academic Dissertation: Marika Juppo, *Atomic Layer Deposition of Metal and Transition Metal Nitride Thin Films and In Situ Mass Spectrometry Studies*, University of Helsinki, Department of Chemistry, 65 pages (2001).

Marika Juppo et al.,*Use of 1,1-Dimethylhydrazine in the Atomic Layer Deposition of Transition Metal Nitride Thin Films*, J. Electrochem. Soc., vol. 147, No. 9, pp. 3377-3381 (2000).

Becker et al., *Highly Conformal Thin Films of Tungsten Nitride Prepared by Atomic Layer Deposition from a Novel Precursor*, American Chemical Society, pp. 2969-2976, (2003).

H. Kim, *Atomic layer deposition of metal and nitride thin films: Current research efforts and applications for semi-conductor device processing*, J. Vac. Sci. Technol. B, vol. 21, No. 6, pp. 2231-2261 (Nov./Dec. 2003).

J.W. Klaus et al., *Atomic Layer Deposition of Tungsten Nitride Films Using Sequential Surface Reactions*, J. Electrochem. Soc., vol.147, No. 3, pp. 1175-1181 (2000).

Teng-Fan Kuo et al., *Microwave-assisted chemical vapor deposition process for synthesizing carbon nanotubes*, J. Vac. So. Technol. B, vol. 19, No. 3, pp. 1030-1033 (May/Jun. 2001).

* cited by examiner

ATOMIC LAYER DEPOSITION METHOD OF FORMING CONDUCTIVE METAL NITRIDE-COMPRISING LAYERS

RELATED PATENT DATA

This patent resulted from a continuation application of U.S. patent application Ser. No. 10/643,680, filed Aug. 18, 2003 now U.S. Pat. No. 7,378,129, entitled "Atomic Layer Deposition Methods of Forming Conductive Metal Nitride Comprising Layers", naming Brenda D. Kraus and Eugene P. Marsh as inventors, the disclosure of which is incorporated by reference.

TECHNICAL FIELD

This invention relates to atomic layer deposition methods of forming conductive metal nitride comprising layers.

BACKGROUND OF THE INVENTION

Integrated circuits are typically formed on a semiconductor substrate such as a silicon wafer or other semiconductive material. In general, layers of various materials which are one of semiconductive, conducting or insulating are used to form the integrated circuits. By way of example, the various materials are doped, ion implanted, deposited, etched, grown, etc. using various processes. A continuing goal in semiconductor processing is to reduce the size of individual electronic components, thereby enabling smaller and denser integrated circuitry.

One type of circuit device is a capacitor. As capacitors continue to get smaller, there is a continuing challenge to obtain sufficient capacitance despite decreasing size. This has been approached by both developing improved materials and in the physical design of the capacitor, for example utilizing stacked and trenched constructions. Simple capacitors are made of two conductive electrodes separated by a dielectric region. Exemplary conductive materials for one or both of the electrodes are conductive metal nitrides, for example TiN. The invention was motivated in developing new methods of forming capacitor electrode layers containing conductive metal nitrides.

While the invention was motivated in addressing the above issues, it is in no way so limited. The invention is only limited by the accompanying claims as literally worded (without interpretative or other limiting reference to the above background art description, remaining portions of the specification or the drawings), and in accordance with the doctrine of equivalents.

SUMMARY

This invention includes atomic layer deposition methods of forming conductive metal nitride comprising layers. In one implementation, an atomic layer deposition method of forming a conductive metal nitride comprising layer includes positioning a substrate within a deposition chamber. A first species is chemisorbed to form a first species monolayer onto the substrate from a gaseous first precursor comprising at least one of an amido metal organic compound or an imido metal organic compound. The first species monolayer comprises organic groups. The chemisorbed first species is contacted with a second precursor plasma effective to react with the first species monolayer to remove organic groups from the first species monolayer. The chemisorbing and contacting are successively repeated under conditions effective to form a layer of material on the substrate comprising a conductive metal nitride.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

An exemplary method of forming a conductive metal nitride comprising layer using an atomic layer deposition (ALD) method in one preferred embodiment is described in connection with FIGS. 1-5. The invention comprises an atomic layer deposition method, although such might be combined with chemical vapor deposition (CVD) or other deposition methods prior to and/or subsequent to an atomic layer deposition method as herein described and claimed. Accordingly, the conductive metal nitride comprising layers which are formed might result from using a combination of the inventive methods disclosed herein with CVD and other methods whether existing or yet-to-be developed. CVD and ALD are used herein as referred to in the co-pending U.S. patent application Ser. No. 10/133,947, filed on Apr. 25, 2002, entitled "Atomic Layer Deposition Methods and Chemical Vapor Deposition Methods", and listing Brian A. Vaartstra as inventor, and which is now U.S. Publication 20030200917. This 20030200917 application is hereby fully incorporated by reference as if presented in its entirety herein.

Figure 1:
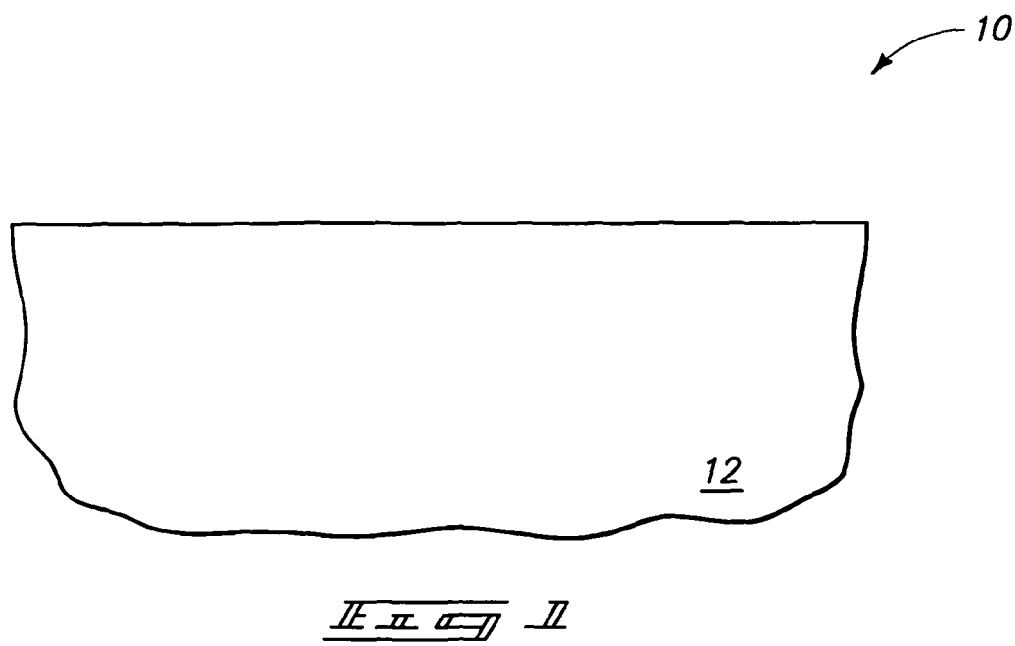
FIG. 1 is a diagrammatic sectional view of a semiconductor wafer fragment in process in accordance with an aspect of the invention.

FIG. 1 depicts a substrate 10 comprising some substrate material 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, material 12 might constitute one or more materials or layers, including conductive metal nitride comprising layers deposited in accordance with existing, inventive, or yet-to-be develop methods. By way of example only, if a capacitor was being fabricated, the outer surface of material 12 might comprise an insulative layer including a conductive node over which a capacitor electrode layer comprising a conductive metal nitride would be deposited.

Figure 2:
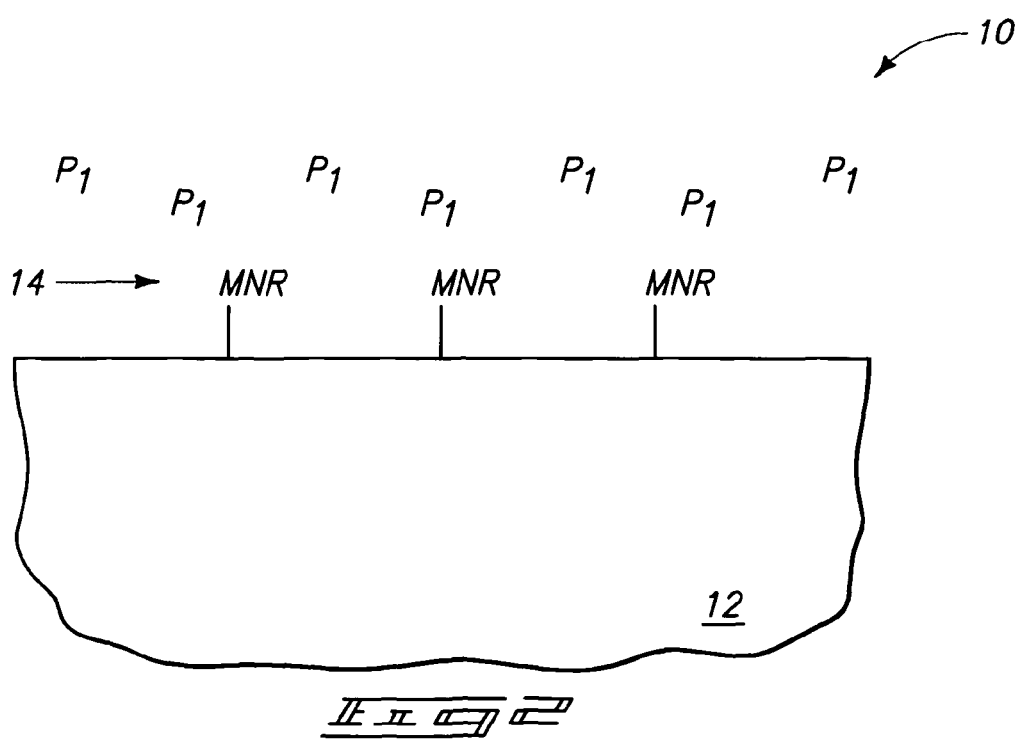
FIG. 2 is a view of the FIG. 1 wafer fragment at a processing step subsequent to that shown by FIG. 1.

Substrate 10 is positioned within a suitable deposition chamber. Referring to FIG. 2, a first species is chemisorbed onto substrate 10 to form a first species monolayer 14 from a gaseous first precursor (i.e., $P_1$). The gaseous first precursor comprises at least one of an amido metal organic compound or an imido metal organic compound. In one exemplary preferred embodiment, the amido metal organic is a tetrakis amido metal compound. Where the layer to be deposited is to comprise hafnium nitride, an exemplary amido precursor is tetrakisdimethylamido hafnium. Exemplary alternate and/or additional materials include trichlorodimethylamido hafnium, tetrakisdiethylamido hafnium and tetrakisethylmethylamido hafnium. Further and by way of example only, exemplary imido metal organic compounds include tris(diethylamido)ethylimido tantalum, bis($^t$butylamido)bis($^t$butylimido) tungsten, which in these examples are also amido precursors. Of course, the first precursor might comprise, consist essentially of, or consist of one or more of the various amido and/or imido metal organic compounds, including a combination of metal organics containing different metals.

FIG. 2 depicts first species monolayer 14 diagrammatically as constituting MNR, and accordingly comprises organic groups. "M" refers to any elemental metal or combination of elemental metals, "N" is nitrogen, and "R" is one or more organic groups. The organic groups "R" might be the same or different. Alkyl groups are preferred, although any organic groups are contemplated. Metal "M" of the resultant metal nitride is preferably selected from the group consisting of any of metal groups 3, 4, 5, 6, 7, the lanthanide series and the actinide series of the periodic table, of course including mixtures thereof. Accordingly, the above metal organics could include any of these metals in addition to/in place of the stated hafnium. In addition to the exemplary hafnium nitride example given above, additional specific preferred examples include titanium nitride, zirconium nitride, tantalum nitride, tungsten nitride, niobium nitride, vanadium nitride and molybdenum nitride.

An exemplary preferred temperature range of the substrate during the chemisorbing is from 100° C. to 600° C., with 200° C. to 400° C. being more preferred. An exemplary preferred pressure range is from $1\times10^{-5}$ Torr to 10 Torr, with a more preferred range being from about $1\times10^{-2}$ Torr to $5\times10^{-2}$ Torr. An exemplary preferred manner of delivering the gaseous first precursor to the chamber is by flowing an inert gas (i.e., He) over a heated liquid volume of the first precursor. An exemplary flow rate of helium for a six liter reactor is from 0 sccm to 1000 sccm, with a more preferred range being from 10 sccm to 150 sccm. Most preferably, the chemisorbing with the first species is void of any plasma.

Figure 3:
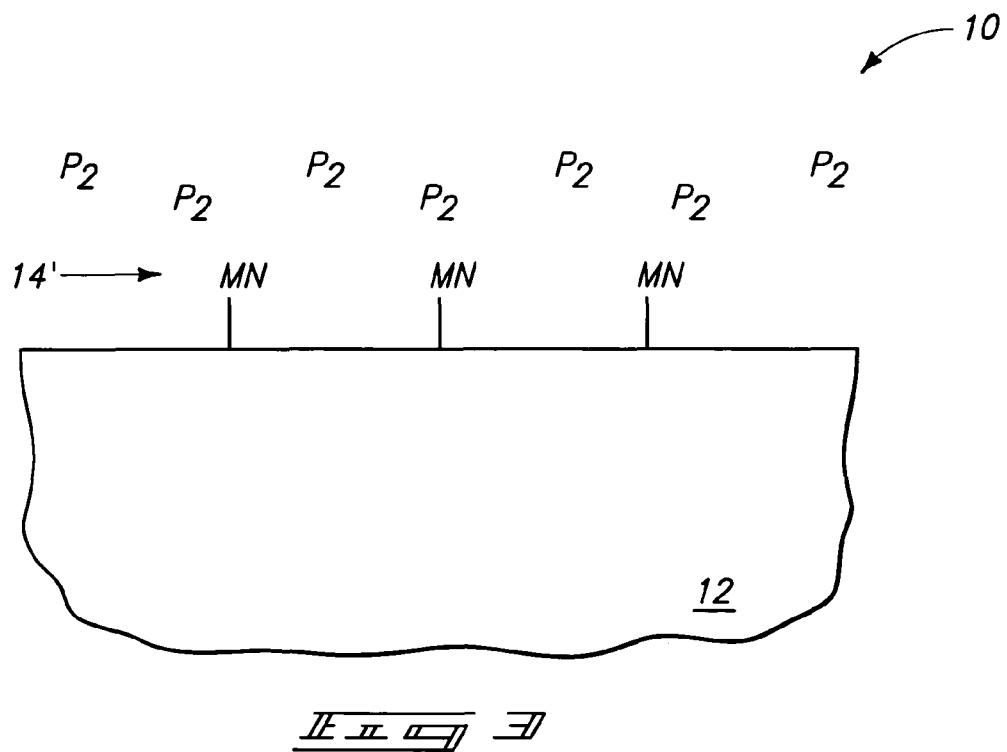
FIG. 3 is a view of the FIG. 2 wafer fragment at a processing step subsequent to that shown by FIG. 2.

Referring to FIG. 3, the chemisorbed first species has been contacted with a second precursor plasma (i.e., $P_2$) effective to react with the first species monolayer to remove organic groups from the first species monolayer. Such is depicted in the formation of monolayer 14' wherein the depicted organic groups "R" are shown as having been removed. Of course, monolayers 14/14' might be less than completely saturated in formation and/or removal over substrate material 12, yet still constitute a monolayer in the context of the disclosure.

Most preferably, the second precursor plasma comprises hydrogen, although such could be void of hydrogen. Exemplary preferred hydrogen containing second precursor plasmas comprise one or more of $SiH_4$, $Si_2H_6$, $BH_3$, $B_2H_6$ and $H_2$. Of course, the second precursor plasma might comprise, consist essentially of, or consist of any one or more of these and other hydrogen containing materials. One preferred embodiment is a second precursor plasma which consists essentially of $H_2$.

Further preferably, the second precursor plasma is void of nitrogen. Yet nitrogen might be utilized, with an exemplary nitrogen containing second precursor plasma comprising, consisting essentially of, or consisting of $NH_3$. By way of example only, another alternate exemplary second precursor plasma comprises CO, for example utilized with or without any hydrogen and/or nitrogen.

An exemplary preferred temperature range of the substrate during the contacting with the second precursor is from 100° C. to 600° C., with 200° C. to 400° C. being more preferred. An exemplary preferred pressure range is from $1\times10^{-5}$ Torr to 10 Torr. An exemplary flow rate for the second precursor for a six liter reactor is from 25 sccm to 25,000 sccm, with a more preferred range being from 800 sccm to 20,000 sccm.

In one exemplary embodiment, there is some period of time intermediate the chemisorbing and contacting wherein no gas is flowed to the deposition chamber. Further, some inert purge gas could also be flowed to the chamber intermediate the chemisorbing and contacting, and regardless of whether there is some time period therebetween when no gas is flowed to the deposition chamber. In one preferred embodiment wherein the chemisorbing first species is void of plasma, the method comprises feeding the second precursor to the chamber in the absence of plasma during such chemisorbing with the first precursor. Accordingly in such instance, the reactive nature of the second precursor only manifests when such has been plasma activated, and which preferably occurs in the absence of any gaseous first precursor within the deposition chamber.

The second precursor plasma can be generated from feeding the second precursor to the deposition chamber with plasma power being applied to the second precursor within the deposition chamber. Alternately or in addition thereto, the second precursor plasma can be generated from applying plasma power to a flowing second precursor externally of the deposition chamber, such as using remote plasma. Where plasma power is provided directly in the deposition chamber, the plasma power might be started prior to feeding the second precursor to the deposition chamber and continued while feeding the second precursor to the deposition chamber, or started after commencing feeding the second deposition precursor to the deposition chamber. Further, such plasma power might be continued after stopping feeding of the second precursor to the deposition chamber.

The invention was reduced-to-practice in a six liter chamber containing an RF powered susceptor/support chuck and a grounded overhead electrode. Highest conductivity films were obtained when plasma power was started prior to feeding the second precursor to the deposition chamber, continued while feeding the second precursor to the deposition chamber, and continued after stopping feeding of the second precursor to the deposition chamber for some period of time. Best results were also obtained when pressure within the chamber during the chemisorbing with the first precursor was lower than it was during the contacting with the second precursor. Preferably, pressure within the chamber during the first precursor chemisorbing is at least five times lower than during the second precursor contacting, and more preferably at least ten times lower. For example, an exemplary preferred pressure during flowing of the gaseous first precursor is about 200 mTorr, and while contacting with the second precursor plasma at about 5 Torr.

Figure 4:
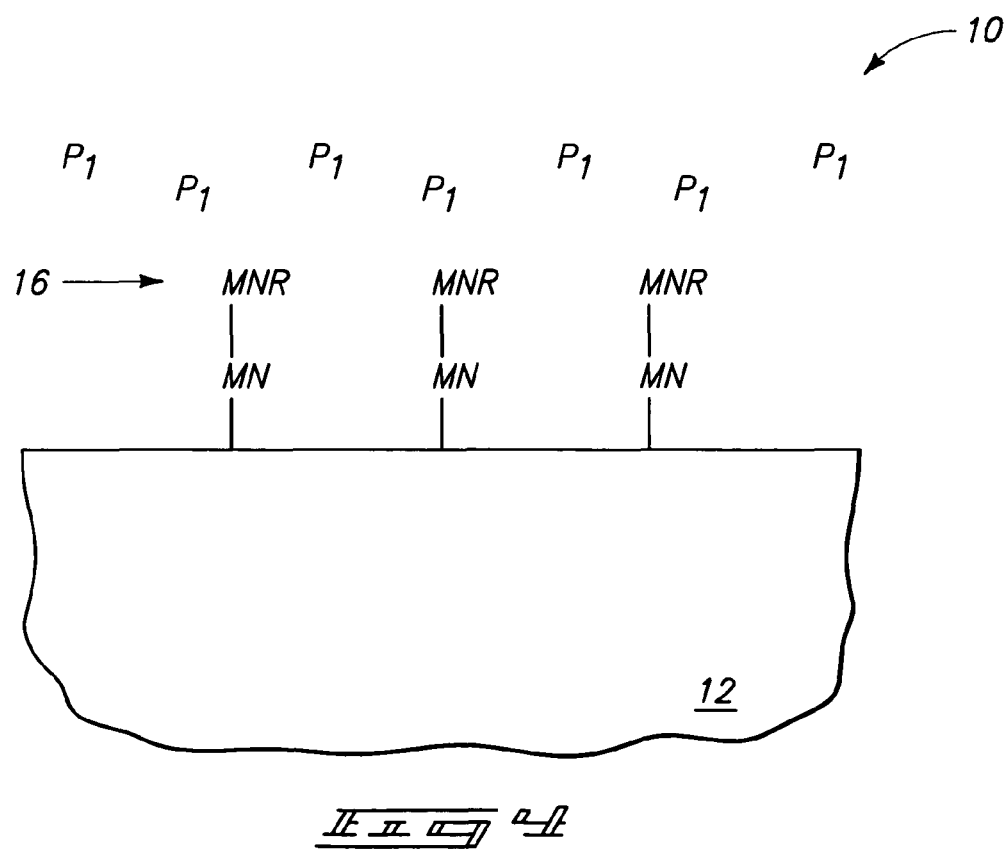
FIG. 4 is a view of the FIG. 3 wafer fragment at a processing step subsequent to that shown by FIG. 3.
Figure 5:
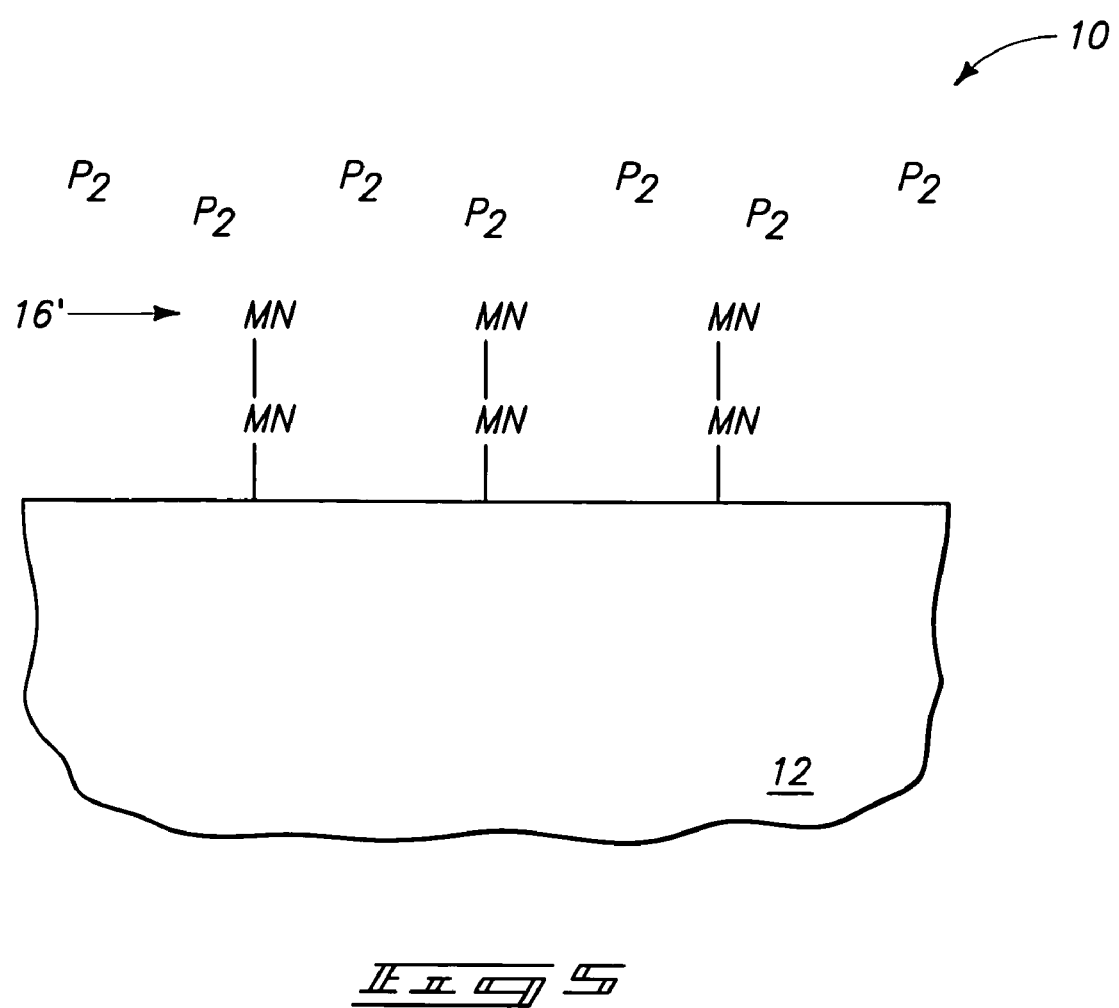
FIG. 5 is a view of the FIG. 4 wafer fragment at a processing step subsequent to that shown by FIG. 4.

The chemisorbing with the gaseous first precursor and the contacting with the second precursor plasma are successively repeated under conditions effective to form a layer of material on the substrate comprising a conductive metal nitride. For example, FIG. 4 depicts exposure of the FIG. 3 substrate to the gaseous first precursor effective to chemisorb another MNR monolayer 16 to monolayer 14'. FIG. 5 depicts subsequent exposure to a second precursor plasma, resulting in MN comprising monolayer 16'.

The depicted examples are diagrammatic only. For example, the layer of material deposited in accordance with aspects of the invention might comprise, consist essentially of, or consist of a conductive metal nitride, as well as in different phases and stoichiometries. For example, where the conductive metal nitride stoichiometry would ideally be an equal atomic ratio of the metal atoms to the nitrogen atoms, the metal atoms might be present in the conductive metal nitride of the layer at an atomic ratio of greater than or less than 1:1. In one preferred example, the metal atoms are present in the conductive metal nitride at an atomic ratio of metal atoms to nitrogen atoms at greater than 1:1, for example which might increase conductivity (reduce resistivity). Further by way of example only, the conductive metal nitride could comprise other materials, for example carbon, such as represented to $MN_xC_y$. Preferably in such instance, carbon is present in the conductive metal nitride at an atomic ratio of carbon atoms to metal atoms of no greater than 1:3. For example with respect to hafnium nitride, some hafnium carbide (HfC) might also form and not be particularly detrimental, as hafnium carbide is itself a conductive material.

By way of example only, it would typically be desirable to fabricate the layer comprising the conductive metal nitride, including nitrides, to have the highest conductivity (lowest resistivity) practical. In one preferred embodiment, the layer of material has a resistivity of no greater than $5 \times 10^3$ microohm·cm, more preferably no greater than $2 \times 10^3$ microohm·cm, and most preferably no greater than $1 \times 10^3$ microohm·cm.

The invention was reduced-to-practice in the deposition of an HfN film onto a semiconductor substrate in an 8-inch thermal and plasma capable CVD tool, modified for ALD precursor pulsing. The gaseous first precursor utilized was tetrakisdimethylamido hafnium, which was contained in a glass bubbler heated to 43° C. by a glycol-heated glass jacket on the bubbler. Helium gas was flowed at 40 sccm over the precursor and into the chamber. The precursor and helium traveled through a valve at the top of the bubbler heated to 65° C. and into a gas line heated to 90° C. Before entering the deposition chamber, the precursor and helium are stopped at a valve, also heated to 85° C., which was pulsed open for three seconds to allow the Hf and He into a showerhead heated to 100° C. stationed at about 2.5 inches above the wafer being deposited upon.

The second precursor plasma was generated within the deposition chamber (by RF power applied thereto) from $H_2$ flowed to the deposition chamber at 10 slm. The gas line was not heated, but did have a valve that pulsed open for about eight seconds to introduce the $H_2$ gas through a side port into the chamber, by-passing the showerhead. RF plasma was generated by a ENI 0-1000 Watt generator. The power setting was 700 Watts and was controlled through software to pulse on ten seconds before the $H_2$ entered the chamber. The plasma stayed on through the $H_2$ pulse for eight seconds and then continued another ten seconds during the pump out of the $H_2$.

Chuck temperature was set at 350° C. However due to heat loss, the wafer temperature was believed to be between 2000 and 230° C. It is believed that the plasma increases the temperature of the wafer, although the actual temperature of the wafer was not measured.

The system was pumped by a Seiko turbopump mounted below the heated chuck. The throttle valve for the chamber was kept wide open to the turbopump, with the pressure of the chamber only affected by the precursor and hydrogen pulses.

The sequencing for this atomic layer deposition as just described was as follows:

One cycle:
  3 seconds—Hf precursor/He pulse into chamber
  5 seconds—pump out of precursor/He
  10 seconds before $H_2$ is pulsed in—RF turned on and pump out continues
  8 seconds—$H_2$ pulse into chamber, RF still on
  10 seconds—RF is turned off, pump out of $H_2$ occurs during this time
  35 seconds—pump out of $H_2$ continues The above sequence, constituting a single cycle, was repeated for a given number of such cycles depending upon the thickness desired. A deposition rate of about 1.6 Angstroms/cycle on a blanket wafer occurred, and 1.0 Angstroms/cycle for a structured wafer.

Best results were obtained with higher RF powers, for example at 700 Watts. Further, best results were obtained with higher $H_2$ flow rates, for example above 5000 sccm.

Resistivity was calculated according to the formula:

$$\text{Sheet resistance (ohms/square)} \times \text{thickness (cm/100)} = \text{resistivity (}\mu\text{ohm·cm)}$$

Sheet resistance was measured using a four point probe resistance tool. For a 322 Angstroms thick film, the resistivity was 827 microohm·cm. A thinner film typically had a higher resistivity. For example, a 165 Angstroms film had a resistivity of 1316 microohm·cm.

Step coverage over 20:1 aspect ratio structures produced about 67% coverage and the film was fairly smooth.

Film composition showed the stoichiometry of the highest conductive films to predominantly comprise hafnium, nitrogen and carbon in the form of HfN and HfC. Analysis determined the stoichiometry of such films to be abut $HfN_{0.48}C_{0.26}$. Oxygen was only present at the surface of the film.

The deposited films might have varying degrees of crystalline and/or amorphous phases.

In one example where plasma was not utilized with the second precursor, resistivity was approximately $1.34 \times 10^7$ microohm·cm. Further, use of $H_2$, as opposed to $NH_3$, yielded by far the lowest resistivity hafnium nitride films. On the other hand, ALD processing in accordance with the invention in the formation of titanium nitride comprising layers utilizing analogous titanium precursors, resulted in by far the lowest resistivity when utilizing $NH_3$ in the second precursor plasma.

In some instances, it is believed that increasing nitrogen incorporation in the conductive metal nitride film tends to reduce the conductivity (increase the resistivity) of the resulting film. Again, best results were obtained if the plasma is turned on prior to feeding the second precursor to the chamber, even where there is no intervening gas flows between the first gaseous precursor feeding and the second gaseous precursor feeding. Sufficient material may still be present within the chamber to be able to strike and maintain a plasma for a sufficient period of time prior to feeding the second precursor to the chamber. By way of example only and not of limitation, it is theorized that the plasma after the self-limiting adsorption of the first precursor and prior to feeding the second precursor, may serve to remove some of the organic ligands containing nitrogen, thereby reducing the ultimate nitrogen content in the film and producing more productive nitride phases.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An atomic layer deposition method of forming a conductive metal nitride-comprising layer in the fabrication of integrated circuitry, comprising:
    providing a substrate within a deposition chamber;
    chemisorbing a first species to form a first species monolayer onto the substrate from a gaseous first precursor comprising at least one of an amido metal organic compound or an imido metal organic compound, the first species monolayer comprising organic groups;
    contacting the chemisorbed first species with a second precursor plasma comprising at least one of $BH_3$ and $B_2H_6$ effective to react with the first species monolayer to remove organic groups from the first species monolayer, pressure within the chamber during the chemisorbing being lower than during the contacting; and
    successively repeating said chemisorbing and contacting under conditions effective to form a layer of material on the substrate comprising a conductive metal nitride.

2. The method of claim 1 wherein the second precursor plasma is void of nitrogen.

3. The method of claim 1 wherein the second precursor plasma comprises $NH_3$.

4. The method of claim 1 wherein the chemisorbing with the first species is void of plasma.

5. The method of claim 1 wherein the chemisorbing with the first species is void of plasma, and further comprising feeding the second precursor to the chamber in the absence of plasma during the chemisorbing.

6. The method of claim 1 wherein the second precursor plasma is generated from feeding the second precursor to the deposition chamber with plasma power being applied to the second precursor within the deposition chamber.

7. The method of claim 6 wherein said plasma power is started prior to feeding the second precursor to the deposition chamber and continued while feeding the second precursor to the deposition chamber.

8. The method of claim 6 wherein said plasma power is continued after stopping feeding of the second precursor to the deposition chamber.

9. The method of claim 6 wherein said plasma power is started prior to feeding the second precursor to the deposition chamber, continued while feeding the second precursor to the deposition chamber, and continued after stopping feeding of the second precursor to the deposition chamber.

10. The method of claim 1 comprising a period of time intermediate said chemisorbing and contacting wherein no gas is flowed to the deposition chamber.

11. The method of claim 10 wherein the second precursor plasma is generated from feeding the second precursor to the deposition chamber with plasma power being applied thereto within the deposition chamber, said plasma power being started prior to feeding the second precursor to the deposition chamber during said period of time and continued while feeding the second precursor to the deposition chamber.

12. The method of claim 1 wherein pressure within the chamber during the chemisorbing is at least five times lower than during the contacting.

13. The method of claim 1 wherein pressure within the chamber during the chemisorbing is at least ten times lower than during the contacting.

14. An atomic layer deposition method of forming a conductive metal nitride-comprising layer in the fabrication of integrated circuitry, comprising:
    providing a semiconductor substrate within a deposition chamber;
    chemisorbing a first species to form a first species monolayer onto the substrate from a gaseous first precursor comprising at least one of an amido metal organic compound or an imido metal organic compound, the first precursor comprising a combination of metal organic compounds containing different metals, the first species monolayer comprising organic groups;
    contacting the chemisorbed first species with a second precursor plasma effective to react with the first species monolayer to remove organic groups from the first species monolayer; the chemisorbing of the first species being void of plasma, and further comprising feeding both of the first precursor and the second precursor to the chamber in the absence of plasma during the chemisorbing; and
    successively repeating said chemisorbing and contacting under conditions effective to form a layer of material on the substrate comprising a conductive metal nitride.

15. An atomic layer deposition method of forming a conductive metal nitride-comprising layer in the fabrication of integrated circuitry, comprising:
    providing a semiconductor substrate within a deposition chamber;
    chemisorbing a first species to form a first species monolayer onto the substrate from a gaseous first precursor comprising at least one of an amido metal organic compound or an imido metal organic compound, the chemisorbing comprising flowing the first precursor to the substrate within the chamber through a showerhead, the first species monolayer comprising organic groups;
    contacting the chemisorbed first species with a second precursor plasma effective to react with the first species monolayer to remove organic groups from the first species monolayer, the second precursor being fed to the substrate during the contacting in a manner which bypasses the showerhead; the chemisorbing of the first species being void of plasma, and further comprising feeding both of the first precursor and the second precursor to the chamber in the absence of plasma during the chemisorbing; and
    successively repeating said chemisorbing and contacting under conditions effective to form a layer of material on the substrate comprising a conductive metal nitride.

16. The method of claim 1 wherein the second precursor plasma comprises $BH_3$.

17. The method of claim 1 wherein the second precursor plasma comprises $B_2H_6$.

* * * * *